(12) United States Patent
Jacquet et al.

(10) Patent No.: US 9,003,654 B2
(45) Date of Patent: Apr. 14, 2015

(54) METHOD FOR METALIZING BLIND VIAS (75) Inventors: Fabrice Jacquet, Saint Pierre de Mesage (FR); Sebastien Bolis, Crolles (FR); Damien Saint-Patrice, Chabeuil (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 1020 days.

(21) Appl. No.: 13/039,902

(22) Filed: Mar. 3, 2011

(65) Prior Publication Data

US 2011/0219612 A1 Sep. 15, 2011

(30) Foreign Application Priority Data

Mar. 10, 2010 (FR) ...................... 10 51726

(51) Int. Cl.
*H01K 3/10* (2006.01)
*H01L 21/768* (2006.01)
(Continued)

(52) U.S. Cl.
CPC ...... *H01L 21/76898* (2013.01); *H01L 21/6835* (2013.01); *H01L 24/24* (2013.01); *H01L 24/32* (2013.01); *H01L 24/82* (2013.01); *H01L 2221/68372* (2013.01); *H01L 2224/0556* (2013.01); *H01L 2224/24011* (2013.01); *H01L 2224/2405* (2013.01); *H01L 2224/24051* (2013.01); *H01L 2224/245* (2013.01);
(Continued)

(58) Field of Classification Search
CPC ................ H01L 21/6835; H01L 21/76898; H01L 24/24; H01L 24/82; H01L 2224/014; H01L 2224/245; H05K 2201/09563; H05K 2201/09581

USPC .................. 29/830, 831, 846, 852; 174/262; 428/209, 210; 438/21
See application file for complete search history.

(56) References Cited

U.S. PATENT DOCUMENTS 8,448,333 B2 * 5/2013 Uyama ............................ 29/852
2006/0083904 A1 * 4/2006 Chung et al. .................. 428/209
(Continued)

FOREIGN PATENT DOCUMENTS

EP    1 650 797 A2   4/2006
JP    2002-144523    5/2002
JP    2003-92467     3/2003

OTHER PUBLICATIONS

U.S. Appl. No. 13/031,917, filed Feb. 22, 2011, Saint-Patrice, et al.
(Continued)

*Primary Examiner* — Donghai D Nguyen
(74) *Attorney, Agent, or Firm* — Oblon, McClelland, Maier & Neustadt, L.L.P.

(57) ABSTRACT

A method for metalizing at least one blind via formed in at least one substrate, including: a) arranging at least one solid portion of electrically conductive material in the blind via, b) performing a thermal treatment of the solid portion of electrically conductive material, making it melt in the blind via, cooling the electrically conductive material, solidifying it in the blind via, and wherein, before carrying out step a), at least part of the walls of the blind via is covered with a material able to prevent wetting of said part of the walls of the blind via by the melted electrically conductive material obtained during the performance of step b), the solidified electrically conductive material obtained after carrying out step c) being able not to be secured to said non-wetting part of the walls of the blind via.

10 Claims, 4 Drawing Sheets

(51) Int. Cl.
*H01L 21/683* (2006.01)
*H01L 23/00* (2006.01)

(52) U.S. Cl.
CPC .......... *H01L2224/32057* (2013.01); *H01L 2224/82101* (2013.01); *H01L 2224/82399* (2013.01); *H01L 2224/82815* (2013.01); *H01L 2224/82896* (2013.01); *H01L 2224/9202* (2013.01); *H01L 2224/92144* (2013.01); *H01L 2224/92244* (2013.01); *H01L 2924/01013* (2013.01); *H01L 2924/01029* (2013.01); *H01L 2924/01047* (2013.01); *H01L 2924/01057* (2013.01); *H01L 2924/01058* (2013.01); *H01L 2924/01061* (2013.01); *H01L 2924/01079* (2013.01); *H01L 2924/01082* (2013.01); *H01L 2924/01005* (2013.01); *H01L 2924/01006* (2013.01); *H01L 2924/01033* (2013.01)

(56) References Cited

U.S. PATENT DOCUMENTS

| | | |
|---|---|---|
| 2006/0177568 A1 | 8/2006 | Hougham et al. |
| 2008/0242079 A1 | 10/2008 | Xu et al. |
| 2009/0032962 A1 | 2/2009 | Hougham et al. |
| 2010/0154211 A1 | 6/2010 | Uyama |
| 2011/0097909 A1 | 4/2011 | Bolis et al. |

OTHER PUBLICATIONS

French Preliminary Search Report issued Jan. 18, 2011, in Patent Application No. 1051726 (with English Translation of Category of Cited Documents).

M. Saadaoui, et al., "New Front to Back-side 3D Interconnects Based High Aspect Ratio Through Silicon Vias", $10^{th}$ Electronics Packaging Technology Conference, 2008, pp. 219-223.

* cited by examiner

METHOD FOR METALIZING BLIND VIAS

CROSS-REFERENCE TO RELATED APPLICATION

This application is based upon and claims the benefit of priority under 35 U.S.C. §119 from prior French Patent Application No. 10 51726, filed on Mar. 10, 2010, the entire content of which is incorporated herein by reference.

TECHNICAL FIELD

The invention relates to the field of microelectronics and more particularly the metallization of at least one blind via formed in at least one substrate. The invention is particularly applicable to performing a simultaneous metallization of several blind vias formed in at least one substrate.

The invention may be used in microelectronics to produce electrical interconnects and/or electrical contact pick-up in a microelectronic substrate, or wafer, i.e. serving as a support for making one or several microelectronics devices.

The invention is particularly adapted to making one or several electrical interconnects between two substrates by metalizing one or several blind vias formed in at least one of the two substrates, or to perform an electrical contact pick-up in an imaging device.

BACKGROUND OF THE INVENTION

It is known to make electrical interconnects or electrical contact pick-ups in a substrate by forming vias, i.e. holes or cavities, in that substrate, then performing a metallization of these vias, i.e. by filling them with an electrically conductive material such as metal.

Such a metallization of vias formed in a substrate can be obtained by implementing traditional vacuum deposition methods, for example PVD (physical vapor deposition), PECVD (plasma-enhanced chemical vapor deposition), electrolysis, etc. These methods are adapted to metalize vias with small diameters, for example smaller than about 100 μm, and small depths. The document "New Front to Back-side 3D Interconnects Based High Aspect Ratio Through Silicon Vias" by Mohamed Saadaoui et Al., 10th EPTC, Singapore, describes a method in which the vias are metalized by an electrolysis done in an ascending manner, i.e. of the "bottom-up" type.

However, these methods become inappropriate when one wishes to metalize vias with larger depths, for example in the case of through vias made in the entire thickness of a silicon substrate whereof the standard thickness is equal to about 720 μm, and even for vias comprising patterns with large dimensions, i.e. comprising a diameter larger than or equal to about 200 μm, due to the extremely long implementation times necessary, and therefore the cost to perform such metallization.

In order to reduce this cost, it is also known to perform metallization of vias by serigraphy: the electrically conductive material is arranged on the substrate in the form of a paste then, using a scraper, that paste is introduced into the vias.

However, such a metallization by serigraphy poses problems in the case of so-called "blind" vias, i.e. non-through vias that emerge at a single face of the substrate and that include a bottom wall. The more frequent flaws then encountered are the imprisonment of air bubbles in the vias, under the electrically conductive material, and/or partial filling of the vias preventing the subsequent realization of electrical contact pick-up formed by the vias on the side of the bottom walls of the vias. Moreover, serigraphy is also not suitable for metalizing vias having a substantial shape factor (ratio of the depth over the diameter of the via), for example greater than 2.

To offset these problems, document JP 2002/144523 A proposes to perform a metallization of the vias by the implementation of vacuum serigraphy. However, the drawbacks related to the implementation of such vacuum serigraphy are numerous:

the modifications that need to be made to the serigraphy material to perform such vacuum serigraphy are very expensive, the time necessary to vacuum the substrate before proceeding with the serigraphy is significant, the serigraphy material used to metalize the vias must be compatible with vacuuming, which requires the use of a polymer/metal composite as metallization material, the quality of the electrical interconnect obtained for example between the serigraphed metallization material and the electrically conductive walls of the via is random.

BRIEF DESCRIPTION OF THE INVENTION

Thus there is a need to propose a method for metalizing at least one blind via not posing the problems of the methods of the prior art, i.e. doing away with the problems of trapping air in the via, that is suitable regardless of the dimensions of the via both in terms of shape factor and depth and section dimensions of the via, that is inexpensive and quick, and can be implemented from any metallization material.

To that end, one embodiment proposes a method for metalizing at least one blind via formed in at least one substrate, including at least the following steps:

a) arranging at least one solid portion of electrically conductive material in the blind via, b) performing a thermal treatment of the solid portion of electrically conductive material, making it melt in the blind via, c) cooling the electrically conductive material, solidifying it in the blind via.

Thus, during the heat treatment of the substrate making the electrically conductive material melt, which therefore forms a fusible material, the latter gradually flows into the via, allowing the air to escape given the fact that the melting of the electrically conductive material is gradual and the free spaces between the inside of the via and the outside environment form the channels by which the air can escape.

Moreover, by using one or several solid portions of electrically conductive material with suitable dimensions, i.e. the dimensions of which are smaller than those of the via, it is therefore possible to perform a metallization of a via regardless of its aspect ratio and its dimensions.

The metallization method is applicable to at least one blind via, i.e. a via formed in at least one substrate, which on a first side emerges at a face of the substrate, and on a second side, opposite the first side, includes a bottom wall. This bottom wall may be temporary, i.e. serving for metallization of the via according to the method first, then being removed to make it possible to access the via from two opposite sides.

"Substrate" refers to a homogeneous structure (i.e. including a single layer) or a heterogeneous structure (i.e. including a set of layers), and may also designate a stack of substrates.

Advantageously, during step a), it is possible to arrange a plurality of solid portions of at least one electrically conductive material in the via, the dimensions of which (e.g. the diameter when the solid portions are microbeads) are smaller than that of the diameter of the via. For example, for a via whereof the section has a dimension (e.g. the diameter) equal to about 30 μm, it is possible to use at least one microbead with a diameter smaller than or equal to about 25 μm. Thus, the spaces between the solid portions form channels allowing air to escape when these solid portions of electrically conductive material are melted.

Advantageously, the solid portion of electrically conductive material may be a microbead. Such a microbead in particular has the advantage of being easily movable on the surface of the substrate at which the blind via emerges by making it roll, so as to position it easily in the via.

Before step a), the microbead may be positioned on a face of the substrate at which the blind via emerges, then pushed and/or rolled in the blind via during step a).

Thus, for example, during step a), the microbead may be positioned in the blind via by means of a blade moved relative to said face of the substrate and/or by making the microbead roll on said face of the substrate.

Alternatively, before step a), the solid portion of electrically conductive material may be positioned on one face of the substrate at which the blind via emerges, and, during step a), the solid portion of electrically conductive material may be positioned in the blind via by making the substrate vibrate.

Before carrying out step a), at least a part of the walls of the blind via is covered with a material able to prevent wetting of said part of the walls of the blind via by the melted electrically conductive material obtained during the performance of step b), the solidified electrically conductive material obtained after carrying out step c) being not secured to, or isolated from, said non-wetting part of the walls of the blind via. The drop angle formed between the electrically conductive material melted then solidified, and the material covering said part of the walls, may be substantially close to about 180°, and at least greater than about 90° C. Thus, it is possible to form, in the via, a metallization that is not in contact with part or some of the walls of the via, for example the lateral walls of the via, thereby forming a "pillar" of electrically conductive material in the via that is not in contact with these walls of the via.

Because the electrically conductive material does not wet the walls of the via, we obtain a mechanical decoupling of the solidified electrically conductive material (pillar) in view of the substrate. The difference between the thermal expansion coefficient of the electrically conductive material (for example equal to about 17 ppm/° C. for copper or greater than about 20 ppm/° C. for some conductive alloys) and the thermal expansion coefficient of the material of the substrate (for example equal to about 2.6 ppm/° C. for silicon or equal to about 3.3 ppm/° C. for the Borofloat type glass) can cause mechanical stress during heat treatments or during the use of components, which can lead to mechanical failure of the whole. The mechanical decoupling thus obtained between the solidified electrically conductive material and the substrate thus improves the robustness of the whole.

Moreover, when the electrically conductive material does not wet the walls of the via, the space formed between the solidified electrically conductive material and the substrate provides an electrical insulation between the substrate (the walls of the via) and the solidified electrically conductive material.

Alternatively, before carrying out step a), at least part of the walls of the blind via may be covered with a material able to make said part of the walls of the blind via wettable by the melted electrically conductive material obtained during the performance of step b), the solidified electrically conductive material obtained after carrying out step c) being able to be in contact with said part of the walls of the wettable blind via.

Thus, it is possible either to completely fill the via with the electrically conductive material, or to make a layer composed of the electrically conductive material along the walls of the via made wettable, according to the dimensions and the number of solid portions positioned in the via during step a).

The blind via may pass through the substrate, called first substrate, such that the blind via emerges at two opposite faces of the first substrate, a bottom wall of the blind via being formed by at least one second substrate secured to the first substrate. This second substrate may be an element permanently secured to the first substrate, for example when the two substrates are part of a microelectronic device, or may be an element temporarily secured to the first substrate in order to form a temporary bottom wall of the blind via, this second substrate being able to then be separated from the first substrate after metallization of the via.

At least one electrical contact may be positioned substantially at a bottom wall of the blind via, and/or on at least one face of the substrate at which the blind via emerges and on all or part of the periphery of the blind via, the solidified electrically conductive material obtained after carrying out step c) being able to be connected to said electrical contact. Thus, the metallization of the via can form a connection electrically connected to said contact(s).

The performance of steps a) to c) may be repeated several times, increasing the quantity of electrically conductive material solidified in the blind via upon each subsequent implementation of step c) relative to the amount of electrically conductive material solidified during a preceding performance of step c).

In this case, during a subsequent performance of step a), the dimensions of the solid portion of electrically conductive material used may be smaller than the dimensions of the solid portion of electrically conductive material used during a preceding performance of step a).

The performance of steps a) to c) may simultaneously perform the metallization of several blind vias formed at least in the substrate.

In this case, before performing step a), a mask may be positioned on one face of the substrate at which the blind vias emerge, the mask being able to include at least one opening aligned with at least one of the blind vias. Such a mask therefore makes it possible to select the vias to be metalized and to cover other vias also formed in the substrate not having to be metalized. Moreover, such a mask also makes it possible to protect the areas of the substrate on which one wishes to avoid the formation of untimely metallization.

BRIEF DESCRIPTION OF THE DRAWINGS

The present invention will be better understood upon reading the description of embodiments provided purely for information and non-limitingly in reference to the appended drawings, in which.

Identical, similar or equivalent parts of the different figures described below bear the same numerical references so as to facilitate the transition from one figure to the next.

The different parts shown in the figures are not necessarily shown using a uniform scale, to make the figures more legible.

The different possibilities (alternatives and embodiments) must be understood as not being mutually exclusive and can be combined with each other.

DETAILED DESCRIPTION OF SPECIFIC EMBODIMENTS

We will first refer to FIGS. 1A to 1F, which illustrate the steps of a method for metalizing a blind via 100 according to a first embodiment.

Figure 1A:
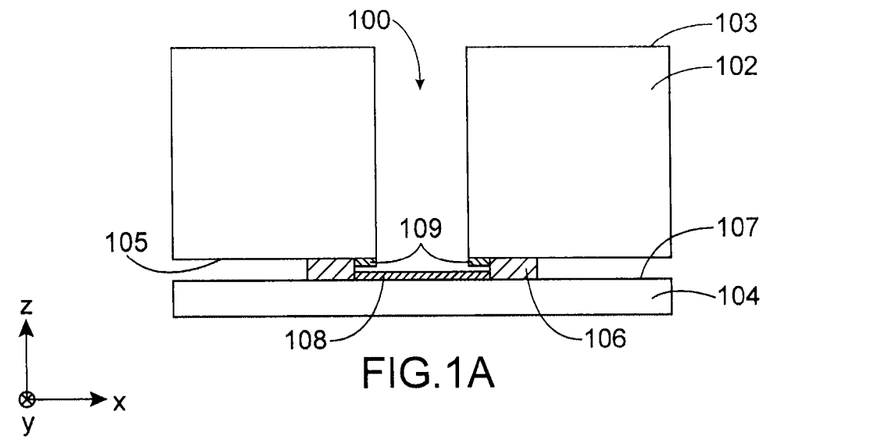
FIGS. 1A to 1F show the steps of a method for metalizing a blind via according to a first embodiment.

As shown in FIG. 1A, the blind via 100 is made in a structure including a first substrate 102 secured to a second substrate 104 by a sealing interface 106. The first and second substrates 102 and 104 are for example silicon-based and each have a thickness (dimension along the Z axis shown in FIG. 1A) equal to about 720 μm. The via 100 for example has a section, in the plane (X,Y) and at the level of the first substrate 102, substantially in the form of a disc and having a diameter for example equal to about 100 μm.

The via 100 passes through the first substrate 102 and therefore emerges both at an upper face 103 of the first substrate 102 and a lower face 105 of the first substrate 102. A bottom wall of the blind via 100 is formed by part of an upper face 107 of the second substrate 104 that is opposite the empty space formed by the via 100 in the first substrate 102. An electrical contact 108, for example composed of an electrically conductive material such as metal (e.g. gold), is positioned at this bottom wall of the via 100. Moreover, electrical contacts 109 are also present in the via 100, at the lower face 105 of the first substrate 102. Although not shown, microelectronic devices (transistors, CMOS sensors, etc.) are made on the first substrate 102 and/or the second substrate 104 and are electrically connected to the electrical contacts 108 and 109. In one alternative, it is also possible for electrical contacts also to be positioned at the upper face 103 of the substrate 102, on the periphery of the via 100.

Figure 1B:
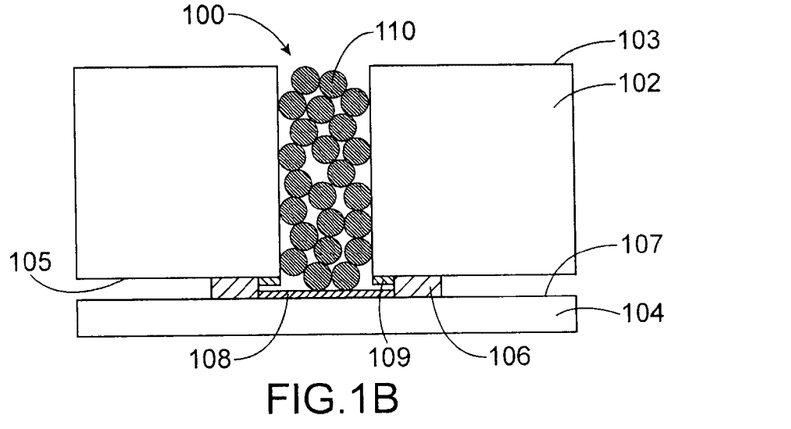

As shown in FIG. 1B, a plurality of microbeads 110 composed of an electrically conductive material are positioned in the blind via 100. To that end, the microbeads 110 are for example first positioned on the upper face 103 of the first substrate 102, then brought into the via 100 using a blade, for example similar to a blade used to perform serigraphy, which brings the microbeads 110 into the blind via 100. In the example of FIG. 1B, the blind via 100 is filled with the microbeads 110. In one alternative, it is also possible to make the microbeads 110 roll on the upper face 103 of the substrate 102 without using a blade, until a sufficient number of microbeads 110 are positioned in the blind via 100.

The electrically conductive material of the microbeads 110 here is a fusible alloy, for example a tin-, silver- and copper-based alloy. The electrically conductive material used may for example be chosen according to the material of the substrate 102 and/or the material of the electrical contacts intended to be in contact with the metallization material (the electrical contacts 108 and 109 in this first embodiment), and for example copper- and/or gold- and/or nickel-based. Care will be taken to choose, for the microbeads 110, a material whereof the fusion temperature is lower than that of the materials of the other elements, in particular of the electrical contacts. The dimensions of the microbeads 110 are smaller than that of the blind via 100. In the example of FIG. 1B, the microbeads 110 all have a substantially similar diameter. However, it is possible to fill the blind via 100 with microbeads 110 having different diameters, which can make it possible to increase the filling compactness of the blind via 100, i.e. to reduce the empty space not occupied by the microbeads 110 in the blind via 100 when the latter is filled with the microbeads 110.

The table below provides the dimensional characteristics of different types of microbeads that can be used in the metallization method.

| Type designation | Maximum diameter | Nominal diameter | Diameter range |
|---|---|---|---|
| Type 2 | | | 75-45 |
| Type 3 | | | 45-20 |
| Type 4 | | | 38-20 |
| Type 5 | 30 μm | 25 μm | 25-10 |
| Type 6 | 20 μm | 15 μm | 15-5 |
| Type 7 | 15 μm | 11 μm | 11-2 |
| Type 8 | 11 μm | 10 μm | 8-2 |

The value indicated in the "maximum diameter" column corresponds to the maximum diameter that a microbead of the type in question can have. The value indicated in the "Nominal diameter" column corresponds to the maximum diameter that at most 1% of the microbeads of this type can have. Lastly, the value range indicated in the "Diameter range" column corresponds to the range of diameters of at least 90% of the microbeads of the type in question.

By making the microbeads 110 from alloy nanoparticles, it is possible to make microbeads with a diameter even smaller than those indicated in the table above. Moreover, there is no technological limit concerning the maximum possible size for the microbeads 110.

The assembly in which the blind via 100 is made, i.e. the substrates 102, 104, then undergoes a thermal treatment, in order to make the microbeads 110 melt. The temperature necessary to melt the microbeads depends on the fusion temperature of the material of the microbeads 110. The table below indicates the liquidus temperatures of alloys that can be used to make the microbeads 110.

| Alloy | Liquidus Temperature (° C.) |
|---|---|
| 34Sn/46Bi/20Pb | 100 |
| 42Sn/58Bi | 138 |
| 43Sn/43Pb/14Bi | 163 |
| 62Sn/36Pb/2Ag | 179 |
| 63Sn/37Pb | 183 |
| 95.5Sn/3.8Ag/0.7Cu | 217 |
| 96.5Sn/3.5Ag | 221 |
| 99.3Sn/0.7Cu | 227 |
| 80Au/20Sn | 280 |

Figure 1C:
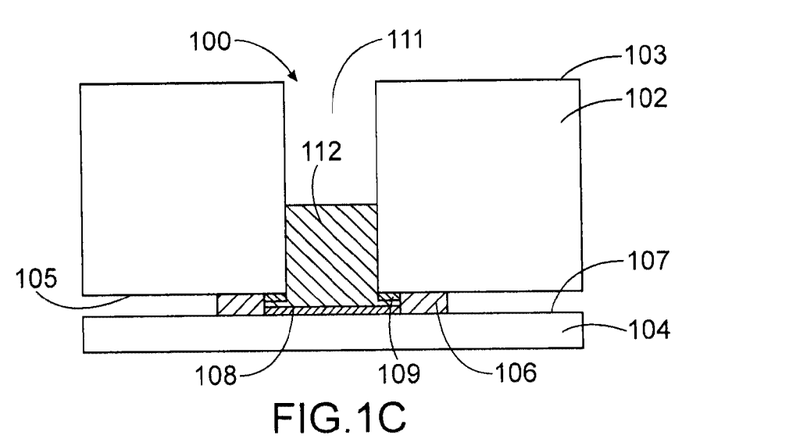

By melting the electrically conductive material of the microbeads 110, said material flows to the bottom of the blind via 100. However, given that empty spaces are present between the microbeads 110 when they are positioned in the blind via 100, the air found under the microbeads 110 can therefore escape through those empty spaces, which makes it possible to metalize the blind via 100 without forming air bubbles under the metallization. As shown in FIG. 1C, the melted material of the microbeads 110 is then cooled, forming a portion 112 of solidified electrically conductive material that corresponds to part of the metallization of the blind via 100. This portion 112 is in contact with the electrical contacts 108 and 109. An empty space 111 is present in the blind via 100, above the portion 112 of solidified electrically conductive material, between the first part 112 of the metallization and the opening of the blind via 100 located at the upper face 103 of the first substrate 102. This empty space 111 substantially corresponds to the empty spaces present between the microbeads 110 before they are melted.

Figure 1D:
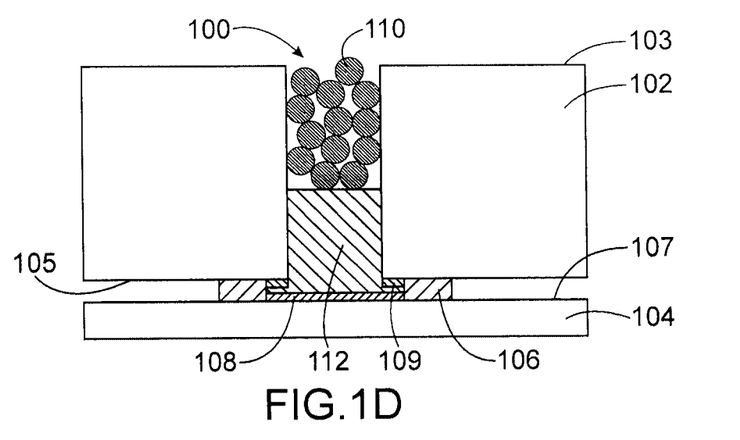

As shown in FIG. 1D, the operation is then repeated by filling the empty space 111 with microbeads 110, for example similar to those used during the preceding filling of the blind via 100.

A new thermal treatment is then done to melt these microbeads 110. The melted material obtained then mixes with the material of the metallization portion 112 that also melts, given that it undergoes the same thermal treatment as the microbeads 110.

Before carrying out this new thermal treatment, it is possible to first treat the metallization portion 112 through a step for deoxidization of its surface during remelting thereof. Such a deoxidization step may be obtained through a formic acid-based treatment.

Figure 1E:
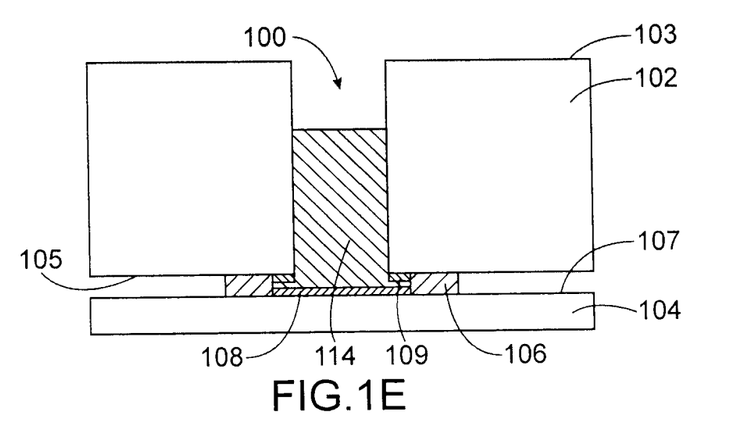

After cooling, a portion 114 of solidified electrically conductive material is obtained occupying, in the blind via 100, a larger volume than the preceding portion 112 of solidified metallization material previously made (FIG. 1E).

Figure 1F:
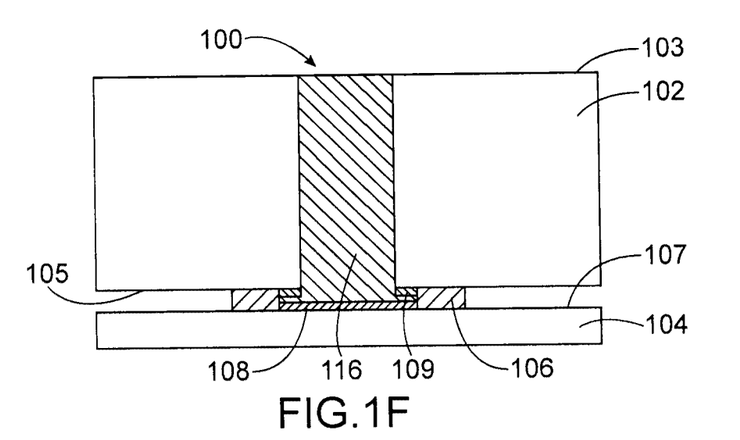

These operations for filling the remaining space of the blind via 100 with microbeads 110, thermal treatment causing the microbeads 110 to melt, then cooling the melted material, are repeated until the blind via 100 is completely filled with electrically conductive material, forming a metallization 116 as shown in FIG. 1F. The metallization 116 thus done therefore forms both a contact pick-up accessible from the upper face 103 of the first substrate 102 and that is electrically connected to the contacts 108 and 109, as well as an electrical interconnect between the contacts 108 and 109.

The implementation of this method makes it possible to completely fill the blind via 100 with a metallization material, without air bubbles being caught in or under the electrically conductive material of the metallization.

In the example method previously described, the microbeads 110 used during the various steps of the method all have a substantially similar diameter. In one alternative, it is possible to use, during the method, microbeads with increasingly smaller sizes as the metallization portion obtained after cooling comes closer to the upper face 103 of the second substrate 102. Thus, in the steps previously described, the microbeads positioned on the portion 112 (those shown in FIG. 1D) could have a smaller diameter than that of the microbeads initially positioned in the blind via (those shown in FIG. 1A).

In this first embodiment, the second substrate 104 is secured to the first substrate 102 permanently by means of the sealing interface 106. In one alternative embodiment, it is possible for the second substrate 104 only to be temporarily secured to the first substrate 102, for the time that the vias are metalized. This second substrate would therefore be used to form temporary bottom walls of the vias 100.

Figure 3:
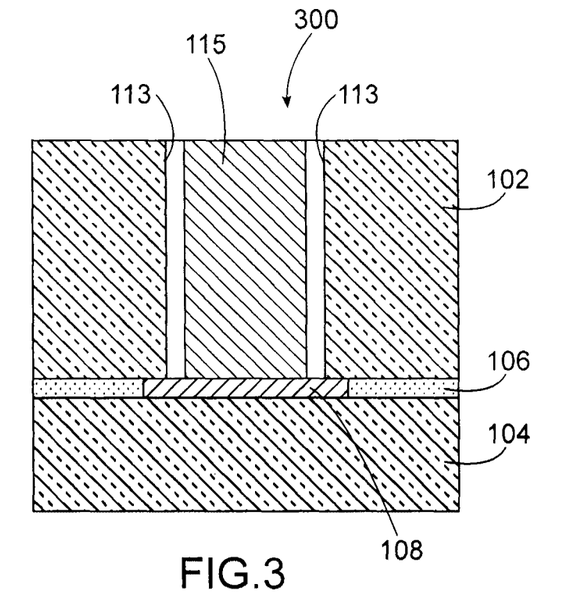
FIG. 3 shows a via metalized using a metallization method according to an alternative of the first embodiment.

FIG. 3 shows a blind via 300 metalized according to an alternative of the method previously described relative to FIGS. 1A to 1F.

Similarly to the via 100 described relative to FIGS. 1A to 1F, the blind via 300 is formed through the first substrate 102, the second substrate 104 being connected to the first substrate 102 by means of the sealing interface 106. An electrical contact 108 is positioned in the bottom of the blind via 300.

In this alternative, lateral walls 113 of the blind via 300 are treated beforehand so as to make them non-wetting relative to the material of the microbeads 110. Such treatment may consist of depositing fluorinated material, for example of the $CF_4$, $C_4F_8$, or $CHF_3$ type, by plasma treatment, for example by PECVD, against the lateral walls 113 of the blind via 300. Such surface treatment forms a very thin layer (few atomic layer or few nanometers) of the fluorinated material against walls 113. It is also possible to make the walls 113 non-wetting by a treatment of the surface of walls 113 with a polydimethylsiloxane type (PDMS) or silicone or Teflon (or a derivative of these components) type coating, for example deposited by spraying.

In that case, during the melting and cooling of the metallization material, this aggregates without wetting the lateral walls 113 of the bind via 300. The solidified electrically conductive material 115 therefore forms, in the via 300, a "pillar" that is not in contact with the lateral walls 113 of the blind via 300.

Thus, the space between the walls 113 of the blind via 300 and the solidified portion of electrically conductive material 115 makes it possible to laterally isolate the electrical contact, formed by the contact 108 connected to the conductive portion 115, of the substrate 102, without requiring prior electrical isolation. The free space between the walls 113 and the portion of solidified electrically conductive material 115 may be left as is or filled, for example using an insulating polymer, for example benzocyclobutene, polyimide, etc.

FIGS. 2A to 2D show the steps of a method for metalizing blind vias 200 according to a second embodiment.

Figure 2A:
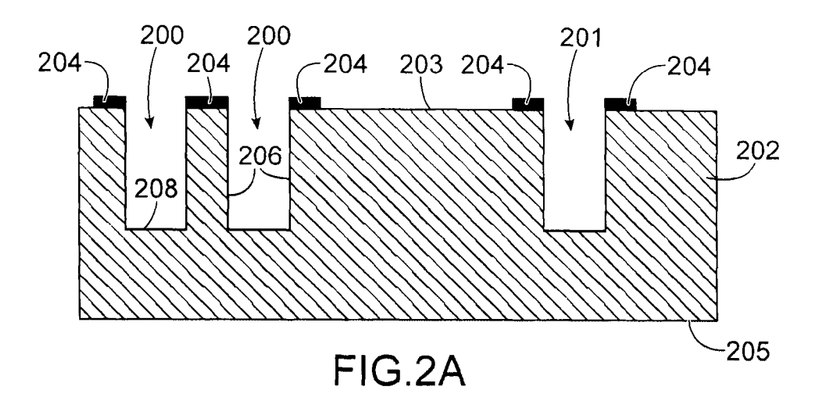
FIGS. 2A to 2D show the steps of a method for metalizing blind vias according to a second embodiment.

As shown in FIG. 2A, the blind vias 200 are made in a substrate 202, for example of a nature and with dimensions similar to those of the first substrate 102 previously described. However, unlike the via 100, the vias 200 do not pass through the substrate 202 and each include a single opening at an upper face 203 of the substrate 202. Electrical contacts 204 are also made on the upper face 203 of the substrate 202, on the periphery of the openings of the vias 200. Another blind via 201, which we do not wish to metalize at the same time as the blind vias 200, is also made in the substrate 202.

Each of the blind vias 200 includes lateral walls 206 as well as a bottom wall 208 formed in the substrate 202. In this second embodiment, the lateral walls 206 and the bottom walls 208 of the vias 200 are treated so as to make them wetting relative to the electrically conductive material that will subsequently be used to metalize the blind vias 200. This treatment may for example consist of a deposition of a suitable material, for example an alloy of nickel and gold, on the lateral walls 206 and the bottom walls 208 of the blind vias 200.

Given that we do not wish to metalize the blind via 201, a mask 209 is placed against the upper face 203 of the substrate 202. This mask 209 includes openings 211 that are substantially aligned with the blind vias 200 that we wish to metalize. On the other hand, the opening of the blind via 201 that we do not wish to metalize is plugged by the mask 209. The mask 209 may for example include a laser-machined stainless steel sheet mechanically pressed on the substrate 202, or include a substrate, for example silicon-based, laser-etched or deep-etched beforehand and mechanically pressed on the substrate 102.

Figure 2B:
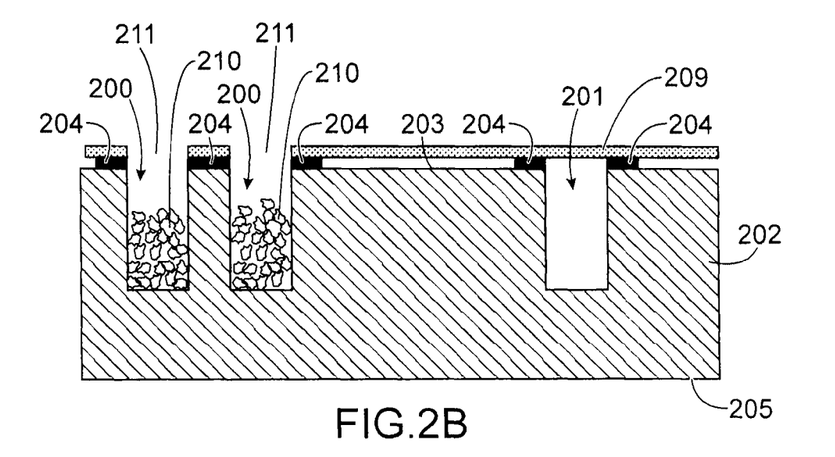

Solid portions 210 of an electrically conductive material, for example of the same nature as that of the microbeads 110 previously described, are then scattered on the mask 209. The solid portions 210 are not microbeads and form pellets with random shapes. The substrate 202 is then made to vibrate so that the desired quantities of solid portions 210 fall into the blind vias 200 to be metalized. The excess solid portions 210 still present on the substrate 200 are then removed, for example by gently blowing on the mask 209 (FIG. 2B). The mask 209 is then removed.

Figure 2C:
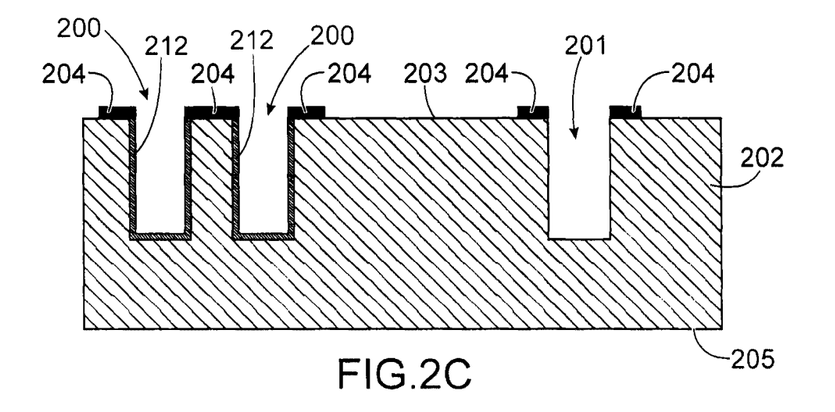

Similarly to the method previously described relative to FIGS. 1A to 1F, a thermal treatment is then done causing the solid portions 210 of electrically conductive material to melt. Due to the treatment previously done to make the lateral walls 206 and the bottom walls 208 wetting relative to the material of the solid portions 210, the melted material of the solid portions 210 does not build up at the bottom of the vias 200, but wets the lateral walls 206 and the bottom walls 208 of the blind vias 200. When cooling, the vias 200 are therefore metalized at their lateral walls 206 and bottom wall 208 covered with a metallization layer 212 composed of an electrically conductive material (FIG. 2C). Moreover, given that the electrical contacts 204 are positioned on the periphery of the openings of the vias 200 and the electrically conductive layers 212 rise to the level of the openings of the vias 200 at the upper face 203 of the substrate 202, electrical contacts are created between the metallization layers 212 and the electrical contacts 204 at each of the vias 200.

Figure 2D:
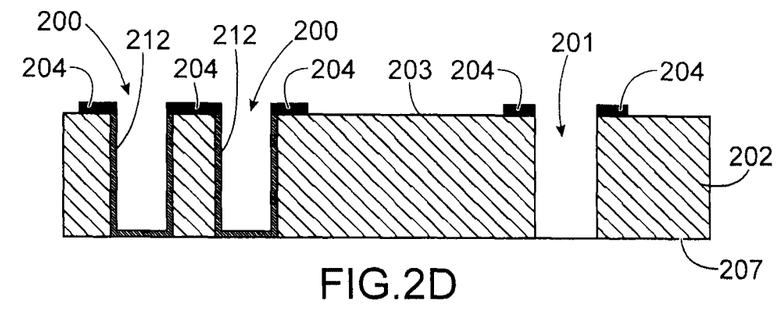

The method is then completed by thinning the substrate 202 at a rear face 205 of the substrate 202, for example by performing a mechanical-chemical planarization with stop on the metallization layer 212. Thus, the electrical contacts 204 are electrically accessible from a rear face 207 of the substrate 202 thinned by means of the metallization layers 212.

In one alternative, and similarly to the first embodiment, it is possible not to perform a prior treatment of the lateral walls 206 and bottom walls 208 of the vias 200 to make these walls wetting relative to the metallization material used. In that case, the metallizations of the vias 200 obtained will be similar to those done for the vias 100, i.e. formed by portions of electrically conductive material completely or partially filling the space in the vias.

In another embodiment, the metallization of the vias may consist of first performing a partial filling of the vias with an electrically conductive material as shown in FIG. 1C, then continuing the metallization of the vias by forming an electrically conductive layer along the portions of the lateral walls of the vias located above the portions of electrically conductive material previously solidified in the vias.

The metallization methods previously described are particularly applicable to metalize the blind vias formed in an imaging device, the vias being able to extend from the upper optical part of the imager to the lower electronic part. Thus, it is possible to pick up the electrical contacts of the electronic part from the optical part of the imager.

Although the vias 100, 200 and 300 previously described all have a disc-shaped section, the metallization method previously described can be applied to vias with any shape whatsoever and any dimensions once it is possible to introduce at least one solid portion, also having any shape whatsoever, of electrically conductive material in the blind via.

The invention claimed is:

1. A method for metalizing at least one blind via formed in at least one substrate, comprising:
   a) covering at least a part of walls of the at least one blind via with a material that prevents wetting of said part of the walls, the material being a fluorinated material or a polymeric material,
   b) arranging at least one solid portion of electrically conductive material in the at least one blind via,
   c) performing a thermal treatment of the solid portion of electrically conductive material, making the electrically conductive material melt in the at least one blind via, and
   d) cooling the electrically conductive material, solidifying the electrically conductive material in the at least one blind via,
   wherein carrying out step a) prevents wetting of said part of the walls of the at least one blind via by the melted electrically conductive material obtained during the performance of step c), the solidified electrically conductive material obtained after carrying out step d) being isolated from said part of the walls of the at least one blind via, wherein the solidified electrically conductive material is mechanically decoupled from the at least one substrate.

2. The method according to claim 1, wherein the solid portion of electrically conductive material is a microbead.

3. The method according to claim 2, wherein, before step b), the microbead is positioned on a face of the at least one substrate at which the at least one blind via emerges, then pushed and/or rolled in the at least one blind via during step b).

4. The method according to claim 1, wherein, before step b), the at least one solid portion of electrically conductive material is positioned on one face of the at least one substrate at which the at least one blind via emerges, and wherein, during step b), the at least one solid portion of electrically conductive material is positioned in the at least one blind via by making the at least one substrate vibrate.

5. The method according to claim 1, wherein the at least one blind via passes through the at least one substrate, called first substrate, such that the at least one blind via emerges at two opposite faces of the first substrate, a bottom wall of the at least one blind via being formed by at least one second substrate secured to the first substrate.

6. The method according to claim 1, wherein at least one electrical contact is positioned substantially at a bottom wall of the at least one blind via, and/or on at least one face of the at least one substrate at which the at least one blind via emerges and on all or part of the periphery of the at least one blind via, the solidified electrically conductive material obtained after carrying out step d) being electrically connected to said electrical contact.

7. The method according to claim 1, wherein the performance of steps b) to d) is repeated several times, increasing the quantity of solidified electrically conductive material in the at least one blind via upon each subsequent implementation of step d) relative to the amount of electrically conductive material solidified during a preceding performance of step d).

8. The method according to claim 7, wherein, during a subsequent performance of step b), the dimensions of the solid portion of electrically conductive dimensions material used are smaller than the dimensions of the solid portion of electrically conductive material used during a preceding performance of step b).

9. The method according to claim 1, wherein the performance of steps b) to d) simultaneously performs the metallization of several blind vias formed in the at least one substrate.

10. The method according to claim 9, wherein, before performing step b), a mask is positioned on one face of the at least one substrate at which the blind vias emerge, the mask including at least one opening aligned with at least one of the blind vias.

* * * * *